US009230614B2

(12) United States Patent
Schaefer et al.

(10) Patent No.: US 9,230,614 B2
(45) Date of Patent: Jan. 5, 2016

(54) SEPARATE MICROCHANNEL VOLTAGE DOMAINS IN STACKED MEMORY ARCHITECTURE

(75) Inventors: Andre Schaefer, Braunschweig (DE); Ruchir Saraswat, Swindon (GB)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/977,404

(22) PCT Filed: Dec. 23, 2011

(86) PCT No.: PCT/US2011/067286
§ 371 (c)(1), (2), (4) Date: Jun. 28, 2013

(87) PCT Pub. No.: WO2013/095676
PCT Pub. Date: Jun. 27, 2013

(65) Prior Publication Data

US 2013/0279276 A1 Oct. 24, 2013

(51) Int. Cl.

| | |
|---|---|
| ***G11C 5/14*** | (2006.01) |
| ***G11C 7/00*** | (2006.01) |
| ***G11C 11/4074*** | (2006.01) |
| ***G11C 5/02*** | (2006.01) |
| ***H01L 25/065*** | (2006.01) |
| ***H01L 25/18*** | (2006.01) |

(52) U.S. Cl.
CPC .................. *G11C 7/00* (2013.01); *G11C 5/025* (2013.01); *G11C 5/147* (2013.01); *G11C 11/4074* (2013.01); *H01L 25/0657* (2013.01); *H01L 25/18* (2013.01); *H01L 2224/16145* (2013.01); *H01L 2224/16225* (2013.01); *H01L 2224/32225* (2013.01); *H01L 2224/73204* (2013.01); *H01L 2225/06513* (2013.01); *H01L 2225/06517* (2013.01); *H01L 2225/06544* (2013.01); *H01L 2924/15311* (2013.01)

(58) Field of Classification Search
CPC ...... G11C 7/00; G11C 11/4074; G11C 5/025; H01L 2225/06517
USPC ........... 365/229, 228, 226; 713/300; 716/120, 716/133
See application file for complete search history.

(56) References Cited

U.S. PATENT DOCUMENTS

| | | | | |
|---|---|---|---|---|
| 7,136,987 | B2 * | 11/2006 | Chen | 711/211 |
| 7,521,950 | B2 * | 4/2009 | Bernstein et al. | 324/750.3 |
| 8,027,215 | B2 * | 9/2011 | Lambertson et al. | 365/218 |
| 8,247,906 | B2 * | 8/2012 | Law et al. | 257/774 |

(Continued)

OTHER PUBLICATIONS

International Search Report and Written Opinion of the International Searching Authority dated Sep. 17, 2012, in International Patent Application No. PCT/US2011/067286, 7 pages.

(Continued)

*Primary Examiner* — Viet Q Nguyen
(74) *Attorney, Agent, or Firm* — Blakely, Sokoloff, Taylor & Zafman LLP

(57) ABSTRACT

Separate microchannel voltage domains in a stacked memory architecture An embodiment of a memory device includes a memory stack including one or more coupled memory dies, wherein a first memory die of the memory stack includes multiple microchannels, and a logic chip coupled with the memory stack, the logic chip including a memory controller. Each of the microchannels includes a separate voltage domain, and a voltage level is controlled for each of the plurality of microchannels.

24 Claims, 10 Drawing Sheets

Memory Controller Interaction with Dynamic Voltage Engine

Traffic to microchannel *n* Monitored by MC-traffic tracker 540

MC detects typical traffic stream pattern - long IDLE phase? 542

No

Yes

MC based traffic future prediction algorithm yields power advantage resulting from changing Vint, e.g. lowering Vint of microchannel *n* 544

MC sends request for Vint change of microchannel *n* to dynamic voltage engine, such as request to reduce Vint 546

Dynamic voltage engine modifies Vint of microchannel *n* 548

(56) References Cited

U.S. PATENT DOCUMENTS

| | | | | |
|---|---|---|---|---|
| 8,271,855 | B2 * | 9/2012 | Norman | 714/764 |
| 8,276,002 | B2 * | 9/2012 | Dennard et al. | 713/300 |
| 8,327,158 | B2 * | 12/2012 | Titiano et al. | 713/300 |
| 8,343,814 | B2 * | 1/2013 | Bucki et al. | 438/142 |
| 8,466,024 | B2 * | 6/2013 | Bartley et al. | 438/270 |
| 8,473,762 | B2 * | 6/2013 | Dennard et al. | 713/300 |
| 8,539,422 | B2 * | 9/2013 | Dai et al. | 716/133 |
| 8,547,769 | B2 * | 10/2013 | Saraswat et al. | 365/226 |
| 8,569,861 | B2 * | 10/2013 | O'Donnell et al. | 257/529 |
| 8,631,381 | B2 * | 1/2014 | Dai et al. | 716/136 |
| 2005/0223155 | A1 | 10/2005 | Chen | |
| 2009/0103345 | A1 | 4/2009 | McLaren et al. | |
| 2010/0074038 | A1 | 3/2010 | Ruckerbauer et al. | |
| 2010/0214812 | A1 | 8/2010 | Kim | |
| 2011/0194326 | A1 | 8/2011 | Nakanishi et al. | |

OTHER PUBLICATIONS

Office Action dated Mar. 12, 2015 (+ English translation), in Taiwan Patent Application No. 101146398, 11 pages.

Notice of Preliminary Rejection dated Aug. 19, 2015 (+ English translation), in Korean Patent Application No. 10-2014-7017941, 7 pages.

* cited by examiner

SEPARATE MICROCHANNEL VOLTAGE DOMAINS IN STACKED MEMORY ARCHITECTURE

CROSS-REFERENCE TO RELATED APPLICATION

This application is a national phase of PCT/US2011/067286 filed Dec. 23, 2011, which application is incorporated herein by reference in its entirety.

TECHNICAL FIELD

Embodiments of the invention generally relate to the field of electronic devices and, more particularly, to separate microchannel voltage domains in a stacked memory architecture.

BACKGROUND

To provide more dense memory for computing operations, concepts involving memory devices (which may be referred to as 3D stacked memory, or stacked memory) having a plurality of closely coupled memory elements have been developed. A 3D stacked memory may include coupled layers or packages of DRAM (dynamic random-access memory) memory elements, which may be referred to as a memory stack.

Stacked memory may be utilized to provide a great amount of computer memory in a single device or package, where the device or package may also include certain system components, such as a memory controller and CPU (central processing unit).

However, in conventional implementations of multichannel 3D stacked DRAM architectures, such as WideIO, the voltage domain (which may be referred to as voltage Vint) for data path, codecs and clocking is the same across each of the multiple microchannels of the architecture. For this reason, it is not possible to modify voltage levels to operate efficiently within each microchannel of the memory device.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
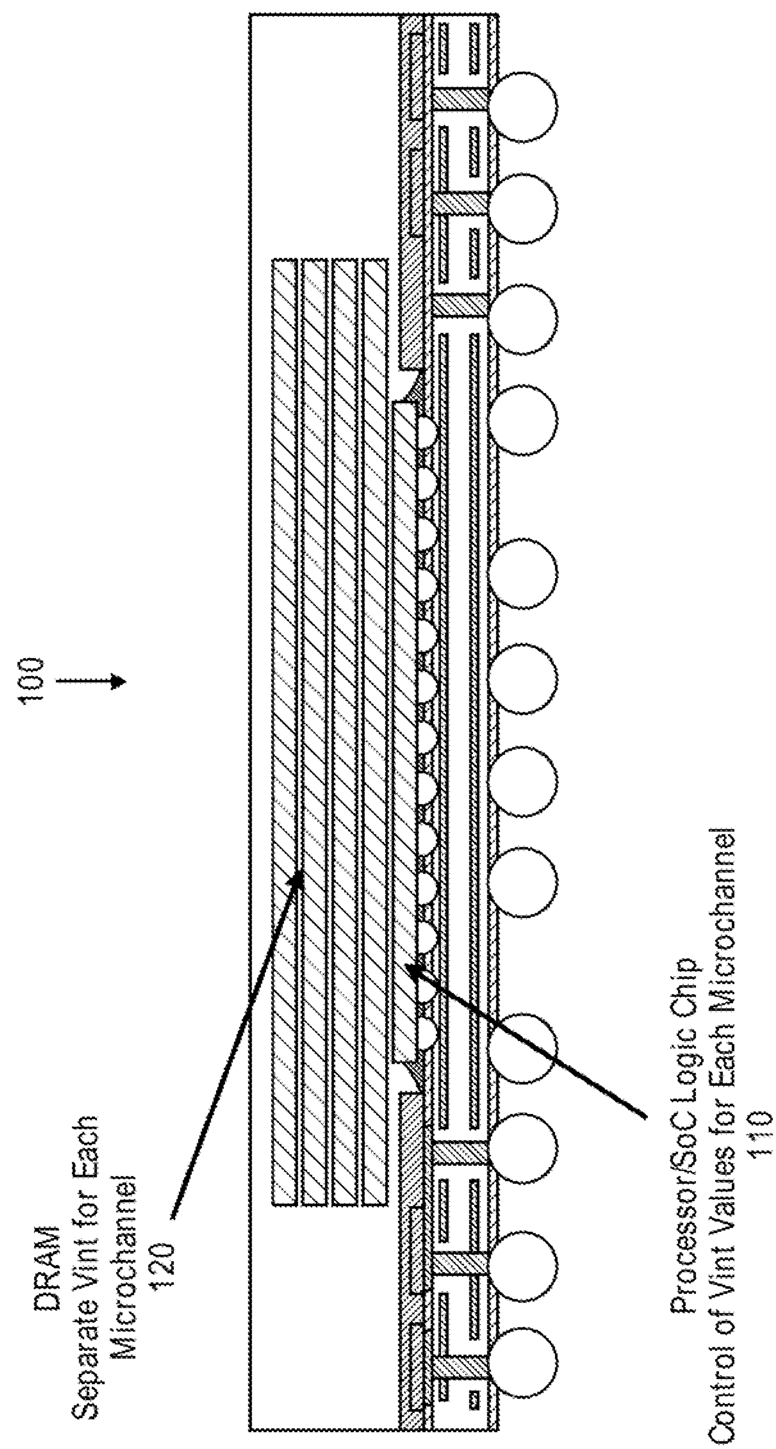
FIG. 1 is an illustration of and embodiment of a stacked memory device.

Embodiments of the invention are generally directed to separate microchannel voltage domains in a stacked memory architecture.

As used herein:

"3D stacked memory" (where 3D indicates three-dimensional) or "stacked memory" means a computer memory including one or more coupled memory layers, memory packages, or other memory elements. The memory (referred to as a memory stack) may be vertically stacked or horizontally (such as side by side) stacked, or otherwise contain memory elements that are coupled together. In particular, a stacked memory DRAM device or system may include a memory device having a plurality of DRAM layers. A stacked memory device may also include system elements (which may be referred to as a logic chip) in the device, where the logic chip may include a CPU (central processing unit), a memory controller, and other related system elements, which may include a power host chip, where the memory stack is stacked with the power host chip. In some embodiments, the logic chip may be an application processor or graphics processing unit (GPU). A 3D stacked memory may include, but is not limited to, a WideIO memory device.

"Microchannel" is a logical, independent memory channel within a 3D memory stack. In general, a memory channel is referred to as a microchannel if the 3D memory stack comprises more than one memory channel, and otherwise the memory stack is a single-channel 3D memory stack.

In multichannel 3D stacked DRAM architectures, such as WideIO, the voltage domain (which may be referred to as voltage Vint) for data path, codecs and clocking is the same across the multiple channels of the architecture. A separate voltage domain per microchannel is not available and therefore power efficiency optimizations per microchannel by adjusting the local Vint aren't possible.

In some embodiments, a memory controller includes a capability to control the DRAM stack power consumption more efficiently. In some embodiments, platforms with multichannel DRAM stacks may be provided with higher power efficiency. In some embodiments, a voltage control feature is enabled through the memory control and CPU of a device.

In some embodiments, an apparatus, system, or method provides that each microchannel of a stacked memory device has a separate local Vint, and that the local Vint for each microchannel is adjustable. In some embodiments, the Vint for each microchannel is supplied by on-die power generators, which may be part of a separate dedicated power generation die (a power host chip), or the power generators may be integrated into a logic chip element (such as a system on chip including the CPU) that is a part of the 3D stacked memory.

In some embodiments, each Vint domain rail of a stacked memory device is connected through a power through silicon via (TSV) of the specific microchannel. In some embodiments, there are no connections between multiple Vint domains of each memory die that hosts the tiles of the different microchannels.

In some embodiments, an alternative implementation integrates the Vint generators within each DRAM die. In some embodiments, each DRAM die of a memory stack contain as many separate Vint domains and generators as the DRAM die hosts microchannels. In such an implementation, a DVS (dynamic voltage scaling) engine in the logic chip generates a control word that controls each of the Vint voltage generators, thus enabling individual scaling of Vint domains.

In some embodiments, a DVS engine maps an activity factor each of the individual microchannels of a stacked memory device. In some embodiments, based at least in part on the activity factor the DVS engine dynamically scales up or down the Vint domains for each of the microchannels of a stacked memory device, thereby allowing for an improved power saving policy in comparison with a conventional device having a single voltage domain.

In some embodiments, the conventional Vint domain of a memory die in a memory stack is split into separate Vint domains for each slice of tiles (or other portion of a memory die) of the respective microchannel (each tile of a die having a separate Vint domain from the other tiles of the die), or may be split with each die being a microchannel (each die having a separate Vint domain from the other dies of the memory stack). In some embodiments, the Vint domains of the tiles belonging to the same microchannel (with a certain slice of the memory stack) are connected through TSV pillars. In some embodiments, the Vint domains are connected to their dedicated Vint generators or are freely adjustable through a control word sent from the memory control or other controller to effectively control all DRAM tiles. In some embodiments, the Vint-controlling per CPU control word provides an implementation approach that is usable when Vint generators are located on the DRAM die. In some embodiments, each DRAM supports a mode for adjustment of its local Vint voltage domain values by changing specific bits in a mode register.

In some embodiments, a memory device includes a memory stack including one or more coupled memory dies, wherein a first memory die of the memory stack includes multiple microchannels, and a logic chip coupled with the memory stack, the logic chip including a memory controller. Each of the microchannels includes a separate voltage domain, and a voltage level is controlled for each of the plurality of microchannels.

In some embodiments, a method includes tracking traffic for a first microchannel of a memory device, the memory device including a logic chip coupled with a memory stack of one or more coupled memory dies, the memory device including a plurality of microchannels, each microchannel having a voltage domain; detecting a traffic pattern for the first microchannel; determining an advantage relating to a change in a voltage of the microchannel; and requesting a change of the voltage of the microchannel.

FIG. 1 is an illustration of and embodiment of a stacked memory device. In some embodiments, a stacked memory device 100 includes a memory stack including one more DRAM die layers 120 that is closely coupled with as a system element, such as a logic chip 110, which may be an SoC or other system element.

In some embodiments, the logic chip 110 may include control for voltage domains for each microchannel of the memory stack 120. In some embodiments, the memory stack or the logic chip 110 includes separate voltage generators for each microchannel of the memory stack. In some embodiments, the logic chip 110 utilizes the control of microchannel voltage domains to control power consumption of the memory device 100.

Figure 2:
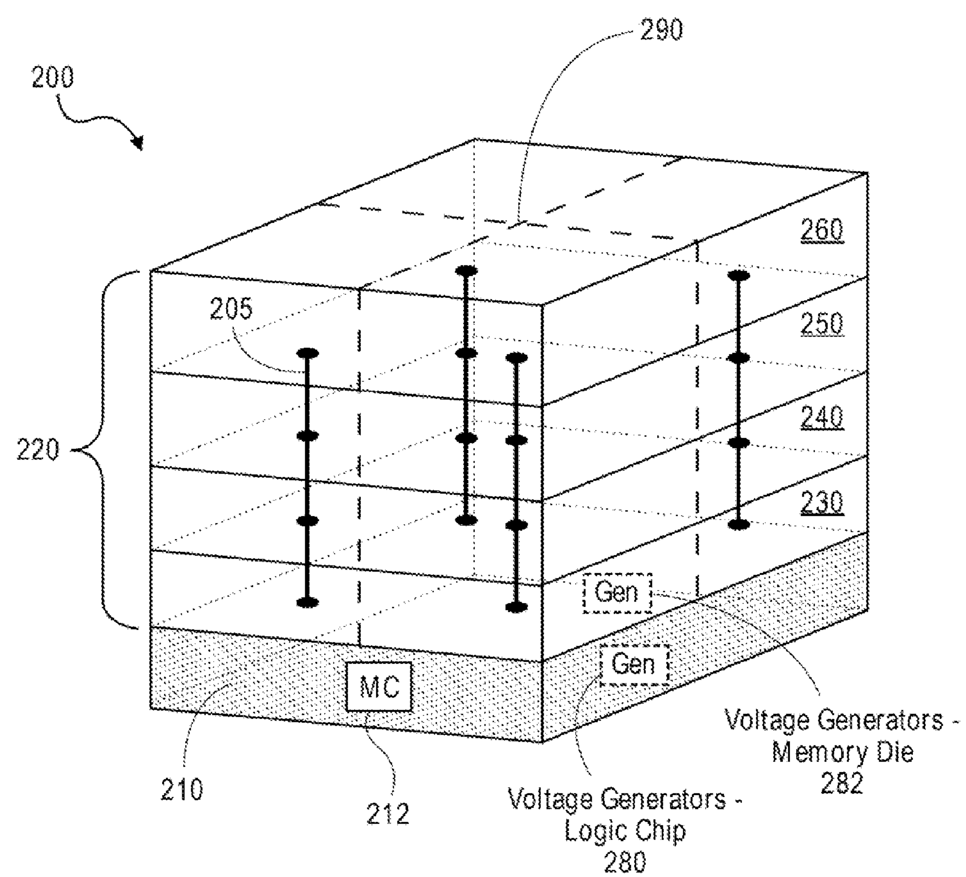
FIG. 2 illustrates an embodiment of a 3D stacked memory.

FIG. 2 illustrates an embodiment of a 3D stacked memory. In this illustration, a 3D stacked memory device 200 includes a system element, such as a logic chip 210, coupled with one or more DRAM memory die layers 220, also referred to herein as the memory stack. In some embodiments, the memory stack 220 includes multiple microchannels. In some embodiments, the system element 210 may be a system on chip (SoC) or other similar element. The elements of this figure and the following figures are presented for illustration, and are not drawn to scale. Each die layer may include a temperature compensated self-refresh (TCSR) circuit to address thermal issues where the TCSR and a mode register (MR) may be a part of management logic of the device, and where the MC may include thermal offset bit(s) for adjustment of refresh rate by the TCSR. The die layers and the system element may be thermally coupled together.

While FIG. 2 illustrates an implementation in which the logic chip 210 is coupled below the memory stack of one or more memory die layers 220, embodiments are not limited to this arrangement. For example, in some embodiments a system element 210 may be located adjacent to the memory stack 220, and thus may be coupled in a side-by-side arrangement with the memory stack 220. In some embodiments, system element 210 may include a power host chip, where the power host chip may provide power for separate Vint domains of microchannels of the memory device.

In this illustration, the DRAM memory die layers include four memory die layers, these layers being a first memory die layer 230, a second memory die layer 240, a third memory die layer 250, and a fourth memory die layer 260. However, embodiments are not limited to any particular number of memory die layers in the memory stack 220, and may include a greater or smaller number of memory die layers. Among other elements, the system element 210 may include a memory controller 212 for the memory stack 220. In some embodiments, each memory die layer (with the possible exception of the top, or outermost, memory die layer, such as the fourth memory die layer 260 in this illustration, which may or may not include TSVs) includes a plurality of through silicon vias (TSVs) 205 to provide paths through the silicon substrate of the memory die layers. In some embodiments, the DRAM memory stack 220 may provide Vint powerpins/microbumps for each Vint domain.

In some embodiments, the memory stack 220 includes a plurality of microchannels, where each slice of tiles of the memory stack is a microchannel (such as the illustrated slices of tiles 290 of the memory stack 220), or where each die is a separate microchannel. In some embodiments, each of the microchannels includes a separate voltage domain with voltage Vint. In some embodiments, the Vint for each microchannel may be generated on each die. In some embodiments, Vint generators 280 for each microchannel are generated in the system element 210, such as a power host chip, and in some embodiments, Vint generators 282 for each microchannel are located in each memory die 230-260.

Figure 3:
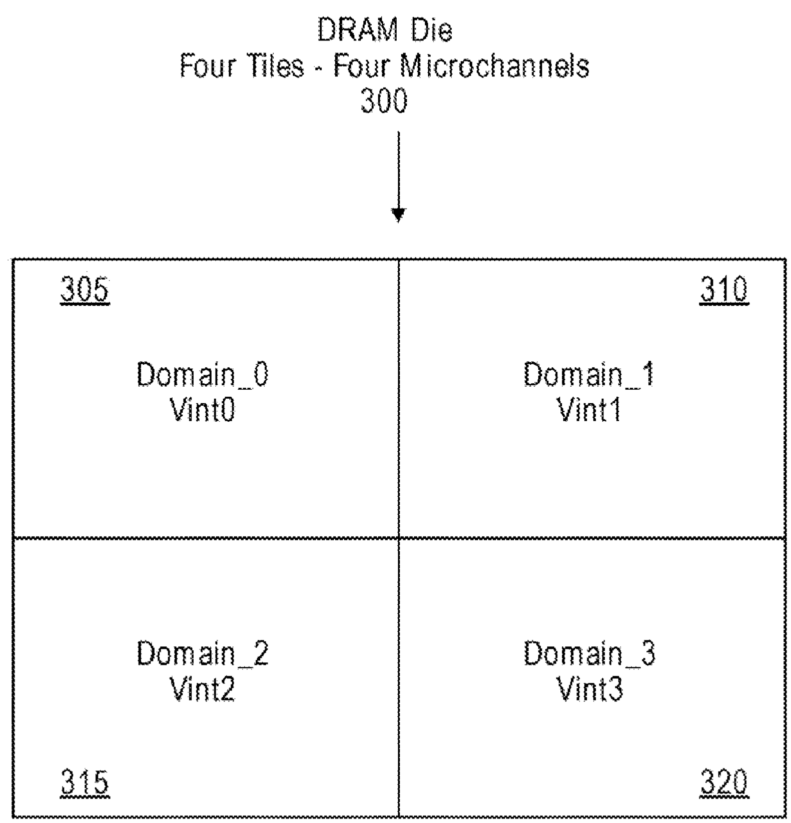
FIG. 3 is an illustration of an embodiment of a memory die with multiple voltage domains.

FIG. 3 is an illustration of an embodiment of a memory die with multiple voltage domains. In this illustration, a DRAM die 300 includes four tiles (or other portions of a die). In some embodiments, each of the tiles contains a separate voltage domain with voltage Vint that can be adjustable separately from the Vint of another tile. In this example, the DRAM die includes a Domain_0 305 with voltage Vint0, a Domain_1 310 with voltage Vint1, a Domain_2 315 with voltage Vint2, and a Domain_3 320 with voltage Vint3. In some embodiments, each voltage domain may be controlled separately from the other Vint values. In some embodiments, other DRAM dies of a memory stack have the same division of tiles, the tiles in a vertical stack forming a slice that represents a particular microchannel.

Figure 4A:
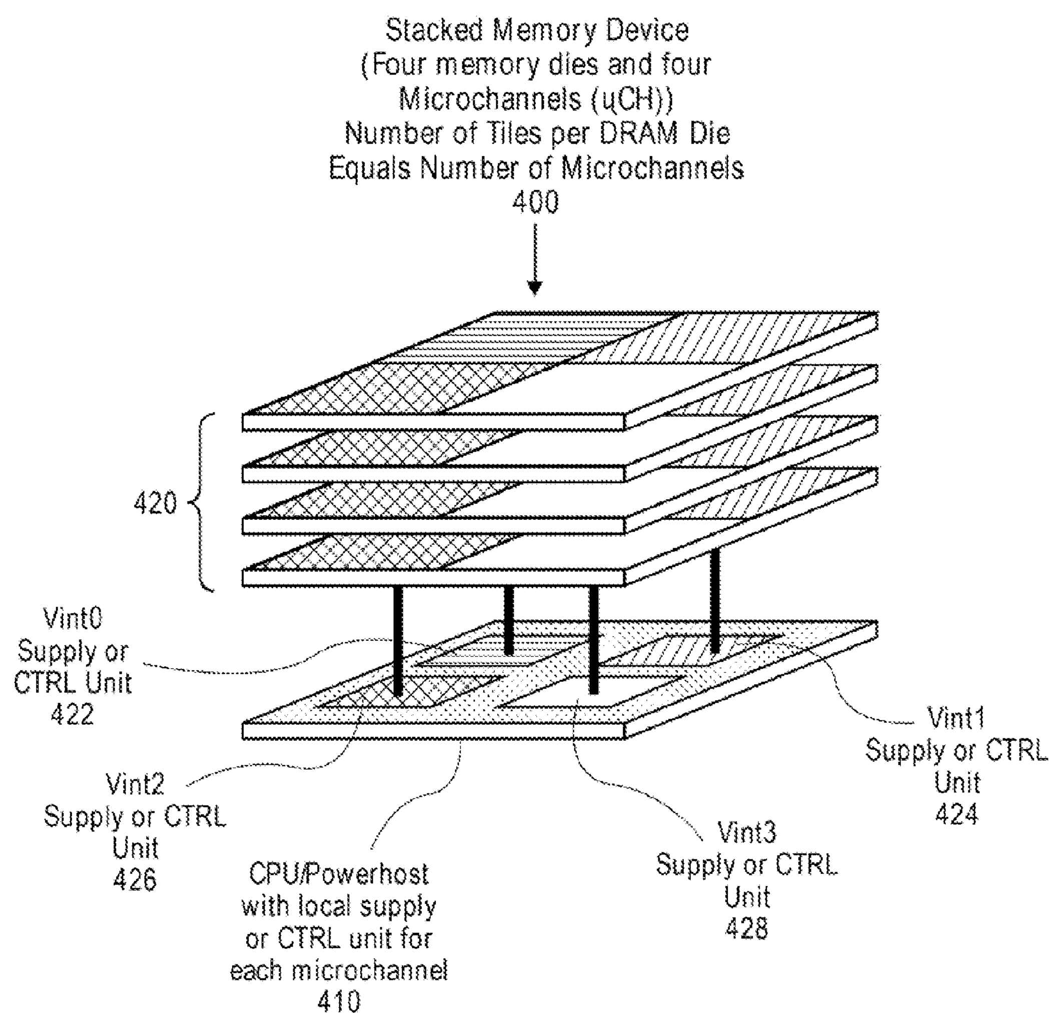
FIG. 4A is an illustration of an embodiment of a stacked memory device providing a separate power domain for each microchannel slice of the memory stack.
Figure 4B:
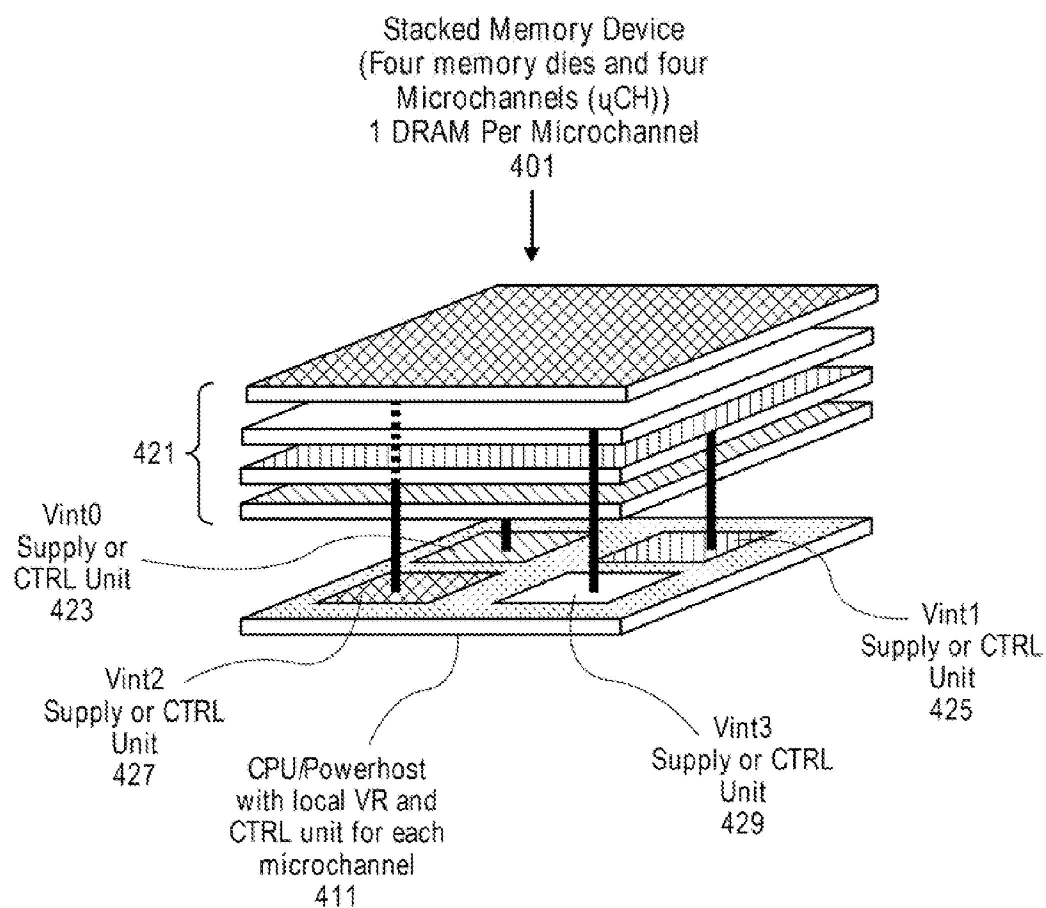
FIG. 4B is an illustration of an embodiment of a stacked memory device providing a separate power domain for each microchannel die of the memory stack.

FIG. 4A and FIG. 4B illustrate two different microchannel implementations:

FIG. 4A is an illustration of an embodiment of a stacked memory device providing a separate power domain for each microchannel slice of the memory stack. In the implementation illustrated in FIG. 4A, each slice or column of tiles is a microchannel, and thus a number of tiles per DRAM memory dies is equal to a number of microchannels, In some embodiments, a stacked memory device 400 includes a logic chip 410 and a memory stack of one or more memory dies 420 coupled with the logic chip 410. In this particular illustration, the memory stack includes four dies, where each die includes four microchannels (μCH0, μCH1, μCH2, and μCH3), and where the microchannels are coupled with the system chip by a plurality of TSVs. In this illustration, there are separate Vint domains across each die (Vint0, Vint1, Vint2, and Vint3), with the same separation of Vint domain existing in each die in the memory stack to form slices of dies, and with connection of the Vint domains being made through TSVs. In some embodiments, the stacked memory device 400 includes a separate power domain for each microchannel, with a voltage supply or control unit for each microchannel.

In this illustration, a voltage supply for each microchannel is located in the logic chip 410, thus between the substrate and the DRAM 3D stack, where the logic chip 410 may include a powerhost chip having a local voltage supply and control unit for each microchannel. In some embodiments, the tiles or other portions of dies that are located in the same column (and thus the same slice) share a common Vint domain that is supplied or controlled by the respective Vint-control unit at controller or CPU of the logic chip 410. In some embodiments, the die tiles in a column are connected by TSVs running through the memory stack. In some embodiments, the power for the voltage domain of the microchannels are supplied or controlled by, for example, Vint0 supply or control unit 422 for a first voltage domain, Vint1 supply or control unit 424 for a second voltage domain, Vint2 supply or control unit 426 for a third voltage domain, and Vint3 supply or control unit 428 for a fourth voltage domain.

FIG. 4B is an illustration of an embodiment of a stacked memory device providing a separate power domain for each microchannel die of the memory stack. In the implementation illustrated in FIG. 4B, each DRAM memory die is a separate microchannel, and thus the number of dies is the number of microchannels. In some embodiments, a stacked memory device 401 includes a logic chip 411 and a memory stack of one or more memory dies 421 coupled with the logic chip 411. In this particular illustration, the memory stack includes four dies, where each die includes a single microchannel (μCH0, μCH1, μCH2, or μCH3), and where the microchannels are coupled with the system chip by a plurality of TSVs. In this illustration, there is a single Vint domain across each die (Vint0, Vint1, Vint2, or Vint3), and with connection of the Vint domains being made through TSVs. In some embodiments, the stacked memory device 401 includes a separate power domain for each microchannel, with a voltage supply or control unit for each microchannel.

In this illustration, a voltage supply for each microchannel is located in the logic chip 411, thus between the substrate and the DRAM 3D stack, where the logic chip 411 may include a powerhost chip having a local voltage supply and control unit for each microchannel. In some embodiments, each die has a Vint domain that is supplied or controlled by the respective Vint supply or control unit of the system element 411. In some embodiments, each die is connected with particular TSVs running through the memory stack. In some embodiments, the power for the voltage domain of the microchannels are supplied or controlled by, for example, Vint0 supply or control unit 423 for a first voltage domain, Vint1 supply or control unit 425 for a second voltage domain, Vint2 supply or control unit 427 for a third voltage domain, and Vint3 supply or control unit 429 for a fourth voltage domain.

Figure 5A:
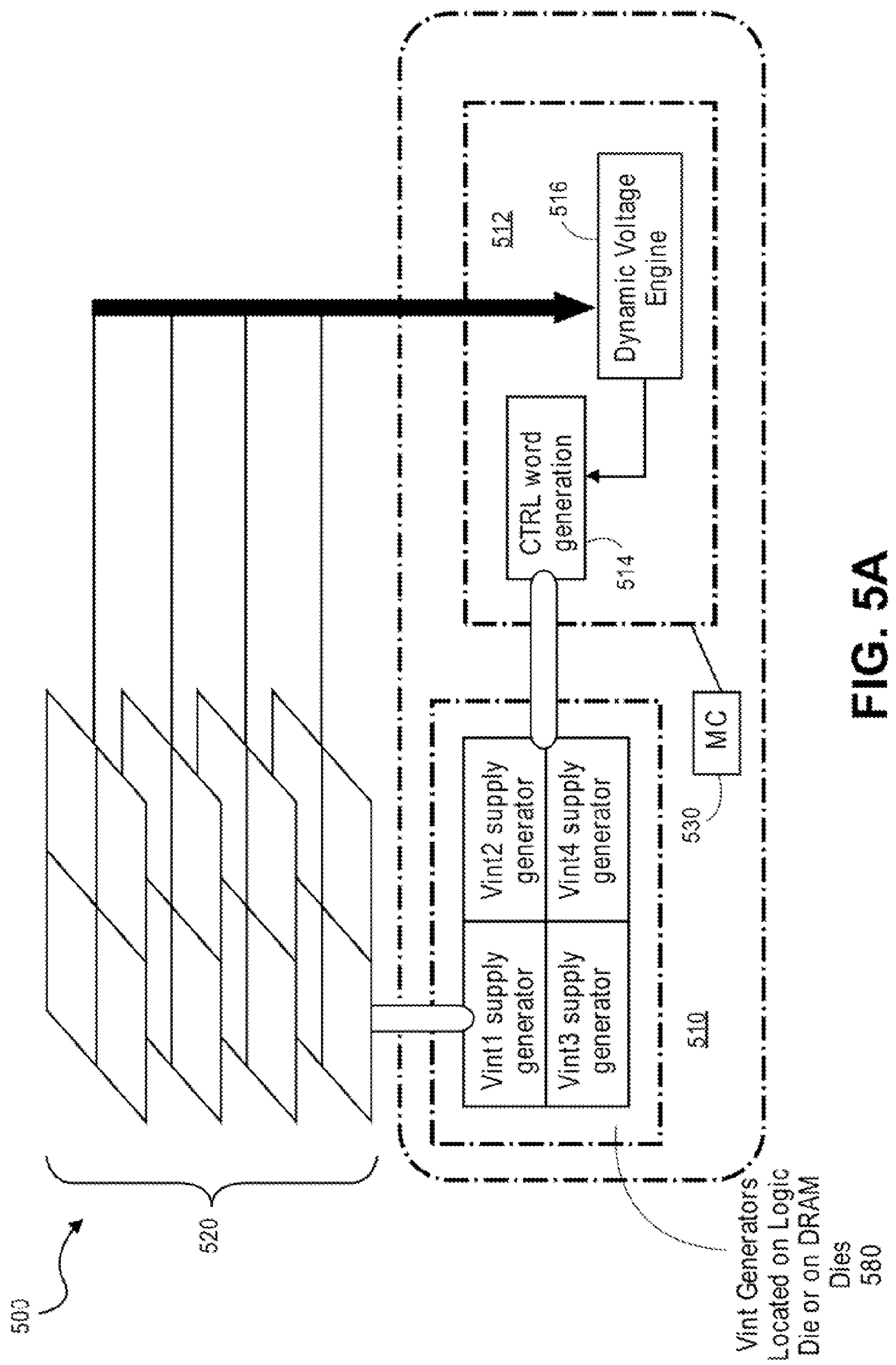
FIG. 5A illustrates an embodiment of a memory apparatus or system providing for power control of microchannels.

FIG. 5A illustrates an embodiment of a memory apparatus or system providing for power control of microchannels. In some embodiments, a stacked memory device 500 includes a memory stack 520 including a plurality of microchannels and a logic chip 510, where the logic chip 510 includes a memory controller 530, and a steering block 512 providing logic for power control of the plurality of microchannels of the memory stack 520. In some embodiments, the steering block 512 includes a dynamic voltage scaling engine 516, where the dynamic voltage scaling engine includes capability for generating control words 514 to control the voltages of the microchannel voltage domains.

In some embodiments, the dynamic voltage scaling engine 516 includes logic for determining the voltage level of each of the voltage domains of the memory stack 520. In some embodiments, the operation of the dynamic voltage scaling engine 516 is based at least in part on feedback information received from the DRAM dies of the memory stack 520. In some embodiments, the operation of the dynamic voltage scaling engine 516 is based at least in part on a lookup table that receives data from by a traffic monitor observing the traffic for each microchannel. In some embodiments, the dynamic voltage scaling engine generates a control word 514 or similar command that is issued to Vint supply generators, where the supply generators 580 may be co-located in the logic die (the supply then being supplied through the TSVs). In some embodiments, the control word is fed direct to the stack, where the stack contains the Vint supply generators 580 locally on the memory dies.

Figure 5B:
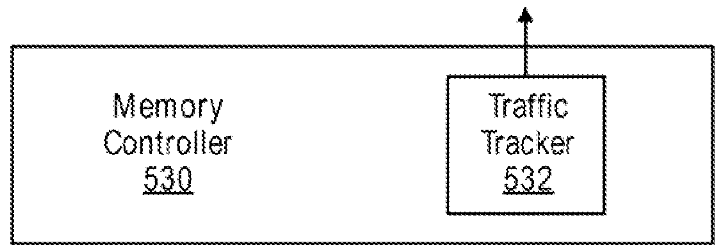
FIG. 5B is an illustration of a memory controller of an embodiment of a memory device.

FIG. 5B is an illustration of a memory controller of an embodiment of a memory device. In some embodiments, a memory controller 530 includes a traffic tracker 532 to track data traffic for the stacked memory device 500, where a use of the traffic tracker in a particular implementation is illustrated in FIG. 5C.

Figure 5C:
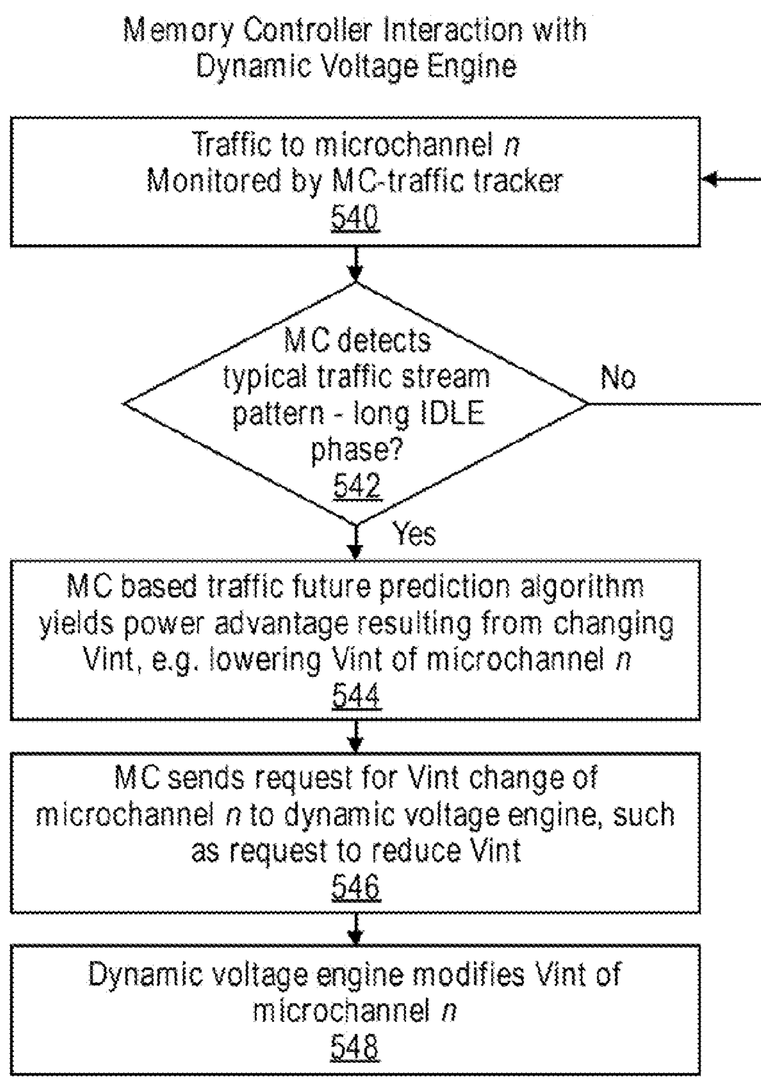
FIG. 5C is a flowchart to illustrate memory controller interaction with the dynamic voltage engine in an embodiment of an apparatus or system.

FIG. 5C is a flowchart to illustrate memory controller interaction with the dynamic voltage engine in an embodiment of an apparatus or system. In some embodiments, traffic to a particular microchannel n is monitored by a memory controller traffic tracker 540, such as traffic tracker 532 of memory controller 530 illustrated in FIG. 5B.

In some embodiments, if the memory controller detects a certain typical traffic stream pattern, where such pattern indicates a long idle phase 542, then a memory controller-based traffic prediction algorithm may identify a power advantage for modifying Vint, such as lowering the Vint of microchannel n because of the long idle state that is indicated for the microchannel 544. In some embodiments, the memory controller transmits a request requesting a Vint change for microchannel n to the dynamic voltage engine 546, which may operate to modify the Vint of the microchannel 548.

Figure 6:
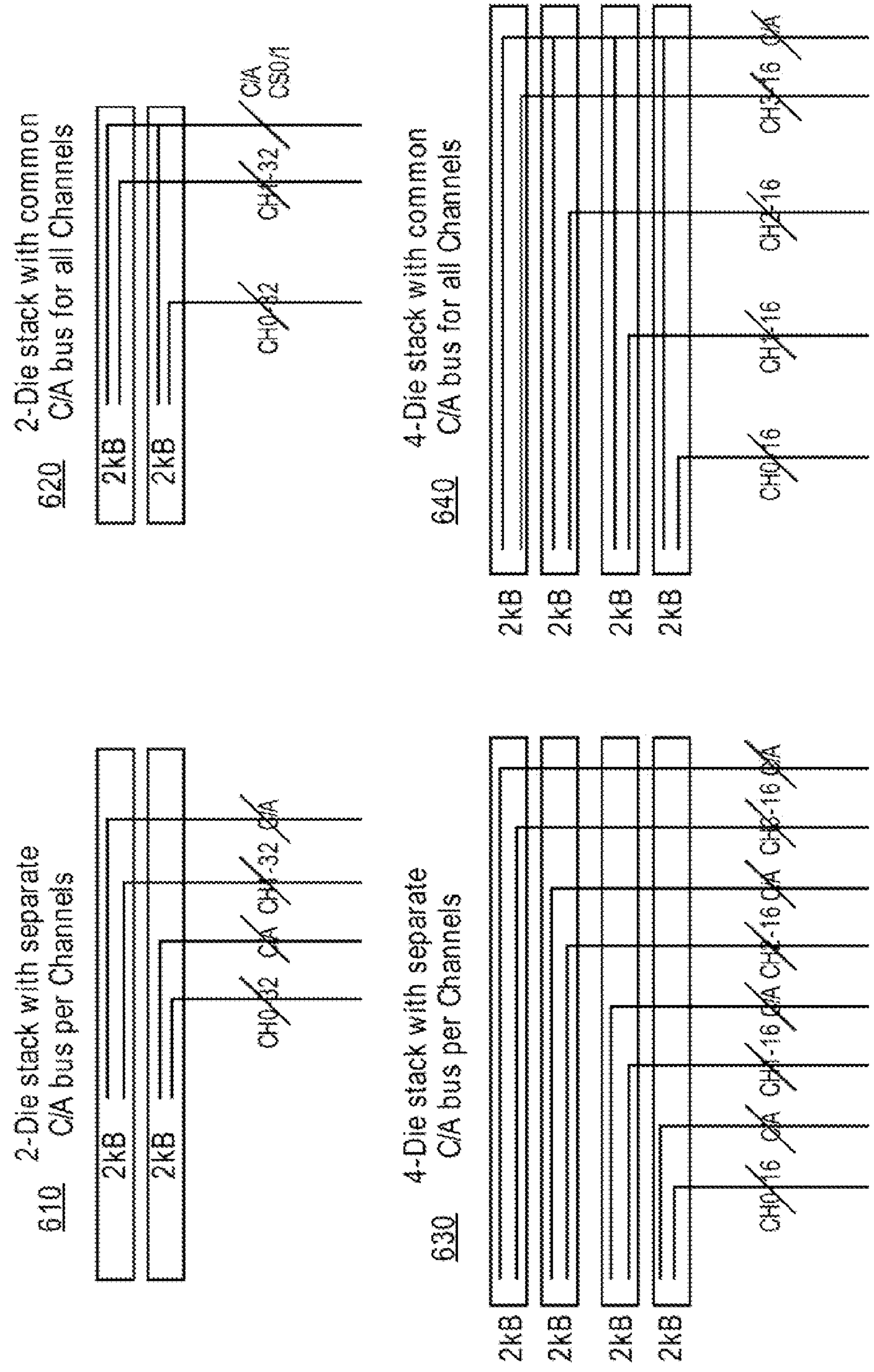
FIG. 6 is an illustration of an architecture of an embodiment of a stacked memory device.

FIG. 6 is an illustration of an architecture of an embodiment of a stacked memory device. In some embodiments, each microchannel of a stacked memory device is driven by one DRAM die in the memory stack. FIG. 6 illustrates certain architectures for memory devices containing two dies and four dies. In some embodiments, a memory stack may include a separate C/A (Command and Address) bus for each channel. In some embodiments, a memory stack may include a common C/A bus for all channels.

In this illustration, a first architecture 610 illustrates a two-die stack with a separate C/A bus for each channel; a second architecture 620 illustrates a two-die stack with a common C/A bus for each channel; a third architecture 630 illustrates a four-die stack with a separate C/A bus for each channel; and a fourth architecture 640 illustrates a four-die stack with a common C/A bus for all channels.

FIG. 6 illustrates different forms of C/A bus topologies and split of IOs across the DRAM dies when the stack grows. In some embodiments, for each such implementation, a Vint domain split and control, such as illustrated in FIG. 4A, can be applied.

Figure 7:
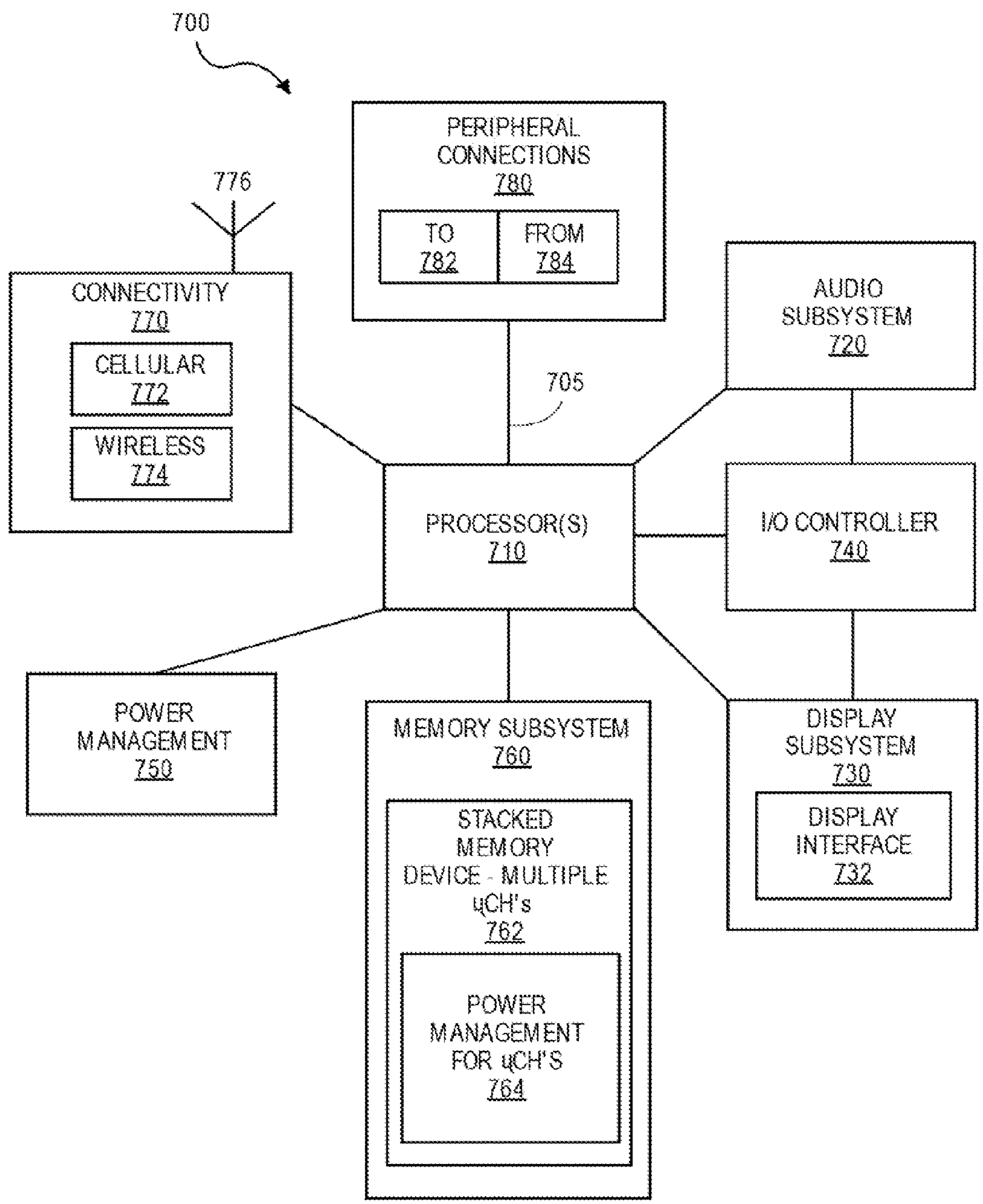
FIG. 7 is a block diagram to illustrate an embodiment of a mobile computing device including a stacked memory device.

FIG. 7 is a block diagram to illustrate an embodiment of a mobile computing device including a stacked memory device. Computing device 700 represents a computing device including a mobile computing device, such as a laptop or notebook computer, a netbook, a tablet computer (including a device having a touchscreen without a separate keyboard; a device having both a touchscreen and keyboard; a device having quick initiation, referred to as "instant on" operation; and a device that is generally connected to a network in operation, referred to as "always connected"), a mobile phone or smartphone, a wireless-enabled e-reader, or other wireless mobile device. It will be understood that certain of the components are shown generally, and not all components of such a device are shown in device 700. The components may be connected by one or more buses or other connections 705.

Device 700 includes processor 710, which performs the primary processing operations of device 700. Processor 710 can include one or more physical devices, such as microprocessors, application processors, microcontrollers, programmable logic devices, or other processing means. The processing operations performed by processor 710 include the execution of an operating platform or operating system on which applications, device functions, or both are executed. The processing operations include operations related to I/O (input/output) with a human user or with other devices, operations related to power management, operations, or both related to connecting device 700 to another device. The processing operations may also include operations related to audio I/O, display I/O, or both.

In one embodiment, device 700 includes audio subsystem 720, which represents hardware (such as audio hardware and audio circuits) and software (such as drivers and codecs) components associated with providing audio functions to the computing device. Audio functions can include speaker, headphone, or both such audio output, as well as microphone input. Devices for such functions can be integrated into device 700, or connected to device 700. In one embodiment, a user interacts with device 700 by providing audio commands that are received and processed by processor 710.

Display subsystem 730 represents hardware (such as display devices) and software (such as drivers) components that provide a display having visual, tactile, or both elements for a user to interact with the computing device. Display subsystem 730 includes display interface 732, which includes the particular screen or hardware device used to provide a display to a user. In one embodiment, display interface 732 includes logic separate from processor 710 to perform at least some processing related to the display. In one embodiment, display subsystem 730 includes a touchscreen device that provides both output and input to a user.

I/O controller 740 represents hardware devices and software components related to interaction with a user. I/O controller 740 can operate to manage hardware that is part of audio subsystem 720, a display subsystem 730, or both such subsystems. Additionally, I/O controller 740 illustrates a connection point for additional devices that connect to device 700 through which a user might interact with the device. For example, devices that can be attached to device 700 might include microphone devices, speaker or stereo systems, video systems or other display device, keyboard or keypad devices, or other I/O devices for use with specific applications such as card readers or other devices.

As mentioned above, I/O controller 740 may interact with audio subsystem 720, display subsystem 730, or both such subsystems. For example, input through a microphone or other audio device can provide input or commands for one or more applications or functions of device 700. Additionally, audio output can be provided instead of or in addition to display output. In another example, if display subsystem includes a touchscreen, the display device also acts as an input device, which can be at least partially managed by I/O controller 740. There can also be additional buttons or switches on device 700 to provide I/O functions managed by I/O controller 740.

In one embodiment, I/O controller 740 manages devices such as accelerometers, cameras, light sensors or other environmental sensors, or other hardware that can be included in device 700. The input can be part of direct user interaction, as well as providing environmental input to the device to influence its operations (such as filtering for noise, adjusting displays for brightness detection, applying a flash for a camera, or other features).

In one embodiment, device 700 includes power management 750 that manages battery power usage, charging of the battery, and features related to power saving operation.

In some embodiments, memory subsystem 760 includes memory devices for storing information in device 700. The processor 710 may read and write data to elements of the memory subsystem 760. Memory can include nonvolatile (having a state that does not change if power to the memory device is interrupted), volatile (having a state that is indeterminate if power to the memory device is interrupted) memory devices, or both such memories. Memory 760 can store application data, user data, music, photos, documents, or other data, as well as device data (whether long-term or temporary) related to the execution of the applications and functions of device 700.

In some embodiments, the memory subsystem 760 may include a stacked memory device 762 including a memory stack of one more memory die layers and including a plurality of microchannels having separate voltage domains. In some embodiments, the stacked memory device 762 includes a power management subsystem for control of the microchannel voltage domains 764, where the power management subsystem 764 includes a dynamic voltage scaling engine to generate signals or commands to adjust voltage levels in each of the microchannels.

Connectivity 770 includes hardware devices (e.g., connectors and communication hardware for wireless communication, wired communication, or both) and software components (e.g., drivers, protocol stacks) to enable device 700 to communicate with external devices. The device could be separate devices, such as other computing devices, wireless access points or base stations, as well as peripherals such as headsets, printers, or other devices.

Connectivity 770 can include multiple different types of connectivity. To generalize, device 700 is illustrated with cellular connectivity 772 and wireless connectivity 774. Cellular connectivity 772 refers generally to cellular network connectivity provided by wireless carriers, such as provided via 4G/LTE (Long Term Evolution), GSM (global system for mobile communications) or variations or derivatives, CDMA (code division multiple access) or variations or derivatives, TDM (time division multiplexing) or variations or derivatives, or other cellular service standards. Wireless connectivity 774 refers to wireless connectivity that is not cellular, and can include personal area networks (such as Bluetooth), local area networks (such as Wi-Fi), wide area networks (such as WiMax), and other wireless communications. Connectivity may include one or more omnidirectional or directional antennas 776.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 may commonly include a "docking" connector to connect to other computing devices for purposes such as managing (such as downloading, uploading, changing, or synchronizing) content on device 700. Additionally, a docking connector can allow device 700 to connect to certain peripherals that allow device 700 to control content output, for example, to audio-visual or other systems.

In addition to a proprietary docking connector or other proprietary connection hardware, device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Figure 8:
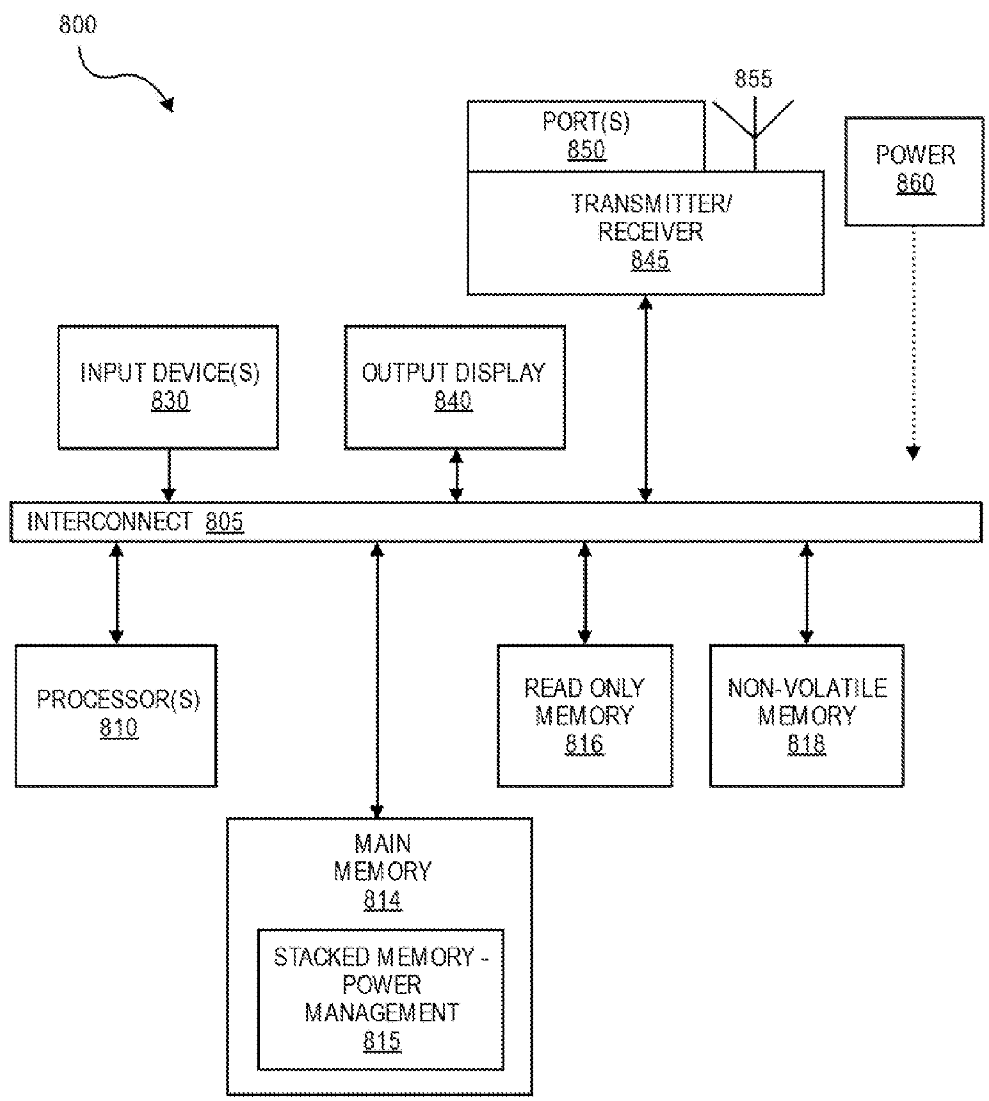
FIG. 8 illustrates an embodiment of a computing system including stacked memory.

FIG. 8 illustrates an embodiment of a computing system including stacked memory. In this illustration, certain standard and well-known components that are not germane to the present description are not shown. The computing system may include a computer, server, game console, or other computing apparatus. Under some embodiments, the computing system 800 comprises an interconnect or crossbar 805 or other communication means for transmission of data. The computing system 800 may include a processing means such as one or more processors 810 coupled with the interconnect 805 for processing information. The processors 810 may comprise one or more physical processors and one or more logical processors. The interconnect 805 is illustrated as a single interconnect for simplicity, but may represent multiple different interconnects or buses and the component connections to such interconnects may vary. The interconnect 805 shown in FIG. 8 is an abstraction that represents any one or more separate physical buses, point-to-point connections, or both connected by appropriate bridges, adapters, or controllers.

In some embodiments, the computing system 800 further comprises a random access memory (RAM) or other dynamic storage device or element as a main memory 814 for storing information and instructions to be executed by the processors 810. RAM memory includes dynamic random access memory (DRAM), which requires refreshing of memory contents, and static random access memory (SRAM), which does not require refreshing contents, but at increased cost. In some embodiments, main memory may include active storage of applications including a browser application for using in network browsing activities by a user of the computing system. DRAM memory may include synchronous dynamic random access memory (SDRAM), which includes a clock signal to control signals, and extended data-out dynamic random access memory (EDO DRAM). In some embodiments, memory of the system may include certain registers or other special purpose memory.

In some embodiments, the main memory 814 includes stacked memory 815, wherein the stack memory includes a plurality of microchannels, each microchannel including a separate voltage domain that is controllable by a controller of the stacked memory. The stacked memory 815 may include memory as illustrated in FIGS. 1-6.

The computing system 800 also may comprise a read only memory (ROM) 816 or other static storage device for storing static information and instructions for the processors 810. The computing system 800 may include one or more non-volatile memory elements 818 for the storage of certain elements.

In some embodiments, the computing system 800 includes one or more input devices 830, where the input devices include one or more of a keyboard, mouse, touch pad, voice command recognition, gesture recognition, or other device for providing an input to a computing system.

The computing system 800 may also be coupled via the interconnect 805 to an output display 840. In some embodiments, the display 840 may include a liquid crystal display (LCD) or any other display technology, for displaying information or content to a user. In some environments, the display 840 may include a touch-screen that is also utilized as at least a part of an input device. In some environments, the display 840 may be or may include an audio device, such as a speaker for providing audio information.

One or more transmitters or receivers 845 may also be coupled to the interconnect 805. In some embodiments, the computing system 800 may include one or more ports 850 for the reception or transmission of data. The computing system 800 may further include one or more omnidirectional or directional antennas 855 for the reception of data via radio signals.

The computing system 800 may also comprise a power device or system 860, which may comprise a power supply, a battery, a solar cell, a fuel cell, or other system or device for providing or generating power. The power provided by the power device or system 860 may be distributed as required to elements of the computing system 800.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically-erasable programmable read-only memory (EE- PROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A memory device comprising:

a memory stack including a plurality of coupled memory dies, wherein the memory stack includes a plurality of microchannels; and a logic chip coupled with the memory stack, the logic chip including a memory controller, the memory controller including a traffic tracker to track traffic of the microchannels and a dynamic voltage scaling engine to provide voltage control for the microchannels;

wherein each of the plurality of microchannels includes a separate voltage domain; and wherein a voltage level is controlled separately for each of the plurality of microchannels, including the memory controller to:

track traffic for each of the plurality of microchannels;

detect a certain traffic pattern for a first microchannel of the plurality of microchannels;

determine a power advantage based at least in part on the detected traffic pattern for the first microchannel, the power advantage relating to a change in a voltage of the first microchannel; and request a change of the voltage of the first microchannel based at least in part on the determined power advantage, the dynamic voltage scaling engine to provide commands to control the voltage level for each of the plurality of microchannels.

2. The memory device of claim 1, wherein each of the plurality of memory dies includes a plurality of tiles, and wherein each tile of a memory die is a microchannel separate from the other tiles of the memory die.

3. The memory device of claim 2, wherein a first tile of a first memory die and a first tile of a second memory die are connected by a through silicon via (TSV) for a first microchannel.

4. The memory device of claim 1, wherein each of the plurality of memory dies is a separate microchannel from the other memory dies.

5. The memory device of claim 1, wherein the dynamic voltage scaling engine is to receive feedback from each of the plurality of microchannels.

6. The memory device of claim 1, further comprising a voltage generator for each of the microchannels, each voltage generator to respond to commands from the dynamic voltage scaling engine.

7. The memory device of claim 6, wherein the voltage generators for the plurality of microchannels are located in the logic chip.

8. The memory device of claim 7, wherein the logic chip is a powerhost chip.

9. The memory device of claim 6, wherein the voltage generators for the plurality of microchannels are located in the one or more memory dies of the memory stack.

10. A method comprising:

tracking traffic for each of a plurality of microchannels of a memory device using a traffic tracker, the memory device including a logic chip coupled with a memory stack of a plurality of coupled memory dies, the memory stack including the plurality of microchannels, each microchannel of the plurality of microchannels having a separate voltage domain; and separately controlling a voltage level for each of the plurality of microchannels based at least in part on microchannel traffic, including:

detecting a certain traffic pattern for a first microchannel of the plurality of microchannels, determining a power advantage based at least in part on the detected traffic pattern for the first microchannel, the power advantage relating to a change in a voltage of the first microchannel, and requesting a change of the voltage of the first microchannel based at least in part on the determined power advantage, the request being provided to a dynamic voltage scaling engine, wherein the dynamic voltage scaling engine is to provide commands to control the voltage level for each of the plurality of microchannels.

11. The method of claim 10, wherein requesting a change of the voltage of the first microchannel includes generating a control word to be directed to a supply generator for the first microchannel.

12. The method of claim 10, wherein the voltage generator for the microchannel is located in a memory die of the memory stack.

13. The method of claim 10, wherein each of the plurality of memory dies includes a plurality of tiles, and wherein each tile of a memory die is a separate microchannel from the other tiles of the memory die.

14. A system comprising:

a processor to process data of the system;

a transmitter, receiver, or both coupled with an omnidirectional antenna to transmit data, receive data, or both; and a memory to store data, the memory including a stacked memory device, the stacked memory device including:

a memory stack including a plurality of coupled memory dies, wherein the memory stack includes a plurality of microchannels; and a logic chip coupled with the memory stack, the logic chip including a memory controller, the memory controller including a traffic tracker to track traffic of each of the microchannels and a dynamic voltage scaling engine to provide voltage control;

wherein each of the plurality of microchannels includes a separate voltage domain; and wherein a voltage level is controlled separately for each of the plurality of microchannels, including the memory controller to:

track traffic for each of the plurality of microchannels;

detect a certain traffic pattern for a first microchannel of the plurality of microchannels;

in response to the detected traffic pattern of the first microchannel, determine a power advantage based at least in part on the detected traffic pattern, the power advantage relating to a change in a voltage of the first microchannel; and request a change of the voltage of the first microchannel based at least in part on the determined power advantage, wherein the dynamic voltage scaling engine is to provide commands to control the voltage level for each of the plurality of microchannels.

15. The system of claim 14, wherein each of the plurality of memory dies includes a plurality of tiles, and wherein each tile of a memory die is a microchannel separate from the other tiles of the memory die.

16. The system of claim 15, wherein a first tile of a first memory die and a first tile of a second memory die are connected by a through silicon via (TSV) for a first microchannel.

17. The system of claim 14, wherein each of the plurality of memory dies is a separate microchannel from the other memory dies.

18. The system of claim 14, wherein the memory device further includes a voltage generator for each of the microchannels.

19. The system of claim 18, wherein the voltage generators for the plurality of microchannels are located in the logic chip.

20. The system of claim 19, wherein the logic chip is a powerhost chip.

21. The system of claim 18, wherein the voltage generators for the plurality of microchannels are located in the one or more memory dies of the memory stack.

22. A non-transitory computer-readable storage medium having stored thereon data representing sequences of instructions that, when executed by a processor, cause the processor to perform operations comprising:

tracking traffic for each of a plurality of microchannels of a memory device using a traffic tracker, the memory device including a logic chip coupled with a memory stack of a plurality of coupled memory dies, the memory stack including the plurality of microchannels, each microchannel of the plurality of microchannels having a separate voltage domain; and separately controlling a voltage level for each of the plurality of microchannels based at least in part on microchannel traffic, including:

detecting a certain traffic pattern for a first microchannel of the plurality of microchannels, determining a power advantage based at least in part on the detected traffic pattern for the first microchannel, the power advantage relating to a change in a voltage of the first microchannel, and requesting a change of the voltage of the first microchannel based at least in part on the determined power advantage, the request being provided to a dynamic voltage scaling engine, wherein the dynamic voltage scaling engine is to provide commands to control the voltage level for each of the plurality of microchannels.

23. The memory device of claim 1, wherein the dynamic voltage scaling engine includes logic to determine the voltage levels of each of the voltage domains of the memory stack.

24. The memory device of claim 23, wherein operation of the dynamic voltage scaling engine is based at least in part on a lookup table that receives data from the traffic tracker tracking the traffic for each of the microchannels.

* * * * *